(12) United States Patent  (10) Patent No.: US 7,666,723 B2
Frank et al. (45) Date of Patent: Feb. 23, 2010

(54) METHODS OF FORMING WIRING TO TRANSISTOR AND RELATED TRANSISTOR

(75) Inventors: David J. Frank, Yorktown Heights, NY (US); Douglas C. La Tulipe, Jr., New Fairfield, CT (US); Steven E. Steen, Peekskill, NY (US); Anna W. Topol, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 429 days.

(21) Appl. No.: 11/677,598

(22) Filed: Feb. 22, 2007

(65) Prior Publication Data

US 2008/0206977 A1   Aug. 28, 2008

(51) Int. Cl.
  *H01L 21/84*  (2006.01)
(52) U.S. Cl. ............. 438/155; 438/455; 257/E21.627
(58) Field of Classification Search ............ 438/155, 438/455; 257/E21.627
  See application file for complete search history.

(56) References Cited

U.S. PATENT DOCUMENTS 5,463,241 A * 10/1995 Kubo .................. 257/376
6,787,875 B2 * 9/2004 Brennan et al. .......... 257/508
2004/0150096 A1   8/2004 Purushothaman et al.
2005/0082526 A1   4/2005 Bedell et al.

OTHER PUBLICATIONS

Guarini et al., "Electrical Integrity of State-of-the-Art 0.13 µm SOI CMOS Devices and Circuits Transferred for Three-Dimensional (3D) Integrated Circuit (IC) Fabrication," IEEE Transactions on Circuits and Systems II, vol. 53, Issue 3, Mar. 2006, 3 pages.
Ieong et al., "Transistor scaling with novel materials," Materialstoday, vol. 9, No. 6, Jun. 2006, pp. 26-31.

* cited by examiner

*Primary Examiner*—Chandra Chaudhari
(74) *Attorney, Agent, or Firm*—Vazken Alexanian; Hoffman Warnick LLC

(57) ABSTRACT

Methods of wiring to a transistor and a related transistor are disclosed. In one embodiment, the method includes a method of forming wiring to a transistor, the method comprising: forming a transistor on a semiconductor-on-insulator (SOI) substrate using masks that are mirror images of an intended layout, the forming including forming a gate and a source/drain region for each and a channel, the SOI substrate including a semiconductor-on-insulator (SOI) layer, a buried insulator layer and a silicon substrate; forming a dielectric layer over the transistor; bonding the dielectric layer to another substrate; removing the silicon substrate from the SOI substrate to the buried insulator layer; forming a contact to each of the source/drain region and the gate from a channel side of the gate; and forming at least one wiring to the contacts on the channel side of the gate.

17 Claims, 12 Drawing Sheets

US 7,666,723 B2

METHODS OF FORMING WIRING TO TRANSISTOR AND RELATED TRANSISTOR

BACKGROUND

1. Technical Field

The disclosure relates generally to integrated circuit (IC) chip fabrication, and more particularly, to methods of forming wiring to a transistor and a related transistor.

2. Background Art

In current field effect transistor (FET) technology, contacts between FETs and a first metal layer are becoming a significant problem for continued scaling. In particular, in order for contacts to reach source/drain regions between the gates of adjacent FETs, they must be extremely tall. Consequently, they must be fabricated with extremely steep sidewalls, very high aspect ratios, very tiny cross sectional area, and very tight alignment tolerances in order to squeeze them into the small space available between the gates. Furthermore, each contact has a significant amount of parasitic capacitance between itself and the gate, which degrades the FET performance. In addition, the contacts have high and potentially quite varied resistance due to their small size and high aspect ratio, which also degrades the FET performance. The contacts also require holes in the stress/strain generating layers, relaxing some of the stress/strain and decreasing FET performance. In addition, advanced transistor design may include new structures (e.g., FINFETs, Trigates, etc.) that require even higher aspect ratio contacts. Overall, processing of these devices is much more complicated and new methods to simplify their fabrication are desirable.

In creating highly interconnected three-dimensional (3D) IC chips, it is advantageous to bond multiple layers of circuitry together from different silicon substrates. This can be done either front-to-front, or front-to-back. Front-to-front bonding is desirable because it eliminates the need for an extra handle wafer, but contacting the devices generally requires an extra layer of wiring between the two device layers. The extra layer adds complexity, costs and size.

SUMMARY

Methods of wiring to a transistor and a related transistor are disclosed. In one embodiment, the method includes a method of forming wiring to a transistor, the method comprising: forming a transistor on a semiconductor-on-insulator (SOI) substrate using masks that are mirror images of an intended layout, the forming including forming a gate and a source/drain region for each and a channel, the SOI substrate including a semiconductor-on-insulator (SOI) layer, a buried insulator layer and a silicon substrate; forming a dielectric layer over the transistor; bonding the dielectric layer to another substrate; removing the silicon substrate from the SOI substrate to the buried insulator layer; forming a contact to each of the source/drain region and the gate from a channel side of the gate; and forming at least one wiring to the contacts on the channel side of the gate.

A first aspect of the disclosure provides a method of forming wiring to a transistor, the method comprising: forming a transistor on a semiconductor-on-insulator (SOI) substrate using masks that are mirror images of an intended layout, the forming including forming a gate and a source/drain region for each and a channel, the SOI substrate including a semiconductor-on-insulator (SOI) layer, a buried insulator layer and a silicon substrate; forming a dielectric layer over the transistor; bonding the dielectric layer to another substrate; removing the silicon substrate from the SOI substrate to the buried insulator layer; forming a contact to each of the source/drain region and the gate from a channel side of the gate; and forming at least one wiring to the contacts on the channel side of the gate.

A second aspect of the disclosure provides a transistor comprising: a gate; a source/drain region; a channel adjacent to the gate; and a contact to at least one of the source/drain region and the gate that extends from a channel side of the transistor.

A third aspect of the disclosure provides a method of forming wiring to a transistor, the method comprising: forming a transistor on a semiconductor layer positioned over an etch stop layer positioned over a silicon substrate using masks that are mirror images of an intended layout, the forming including forming a gate and a source/drain region for each; forming an insulating layer over the transistor; bonding the dielectric to another substrate, the another substrate including one of: a blank substrate and a substrate including at least one of the following: devices and wiring patterned therein; removing the silicon substrate to the etch stop layer; forming a contact through the etch stop layer to each of the source/drain region and the gate, wherein the contact forming includes: patterning and etching a contact via hole through the etch stop layer to each of the source/drain region and the gate, etching through the source/drain region to expose a conductor thereof and through or to the gate to expose a conductor thereof, wherein the conductor includes: a) for the source/drain region, a silicide of the source/drain region, and b) for the gate: b1) in the case that the gate includes polysilicon, a silicide of the gate, or b2) in the case that the gate includes a metal, the metal of the gate, and forming metal in the contact via holes; and forming at least one wiring to the contacts.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1A:
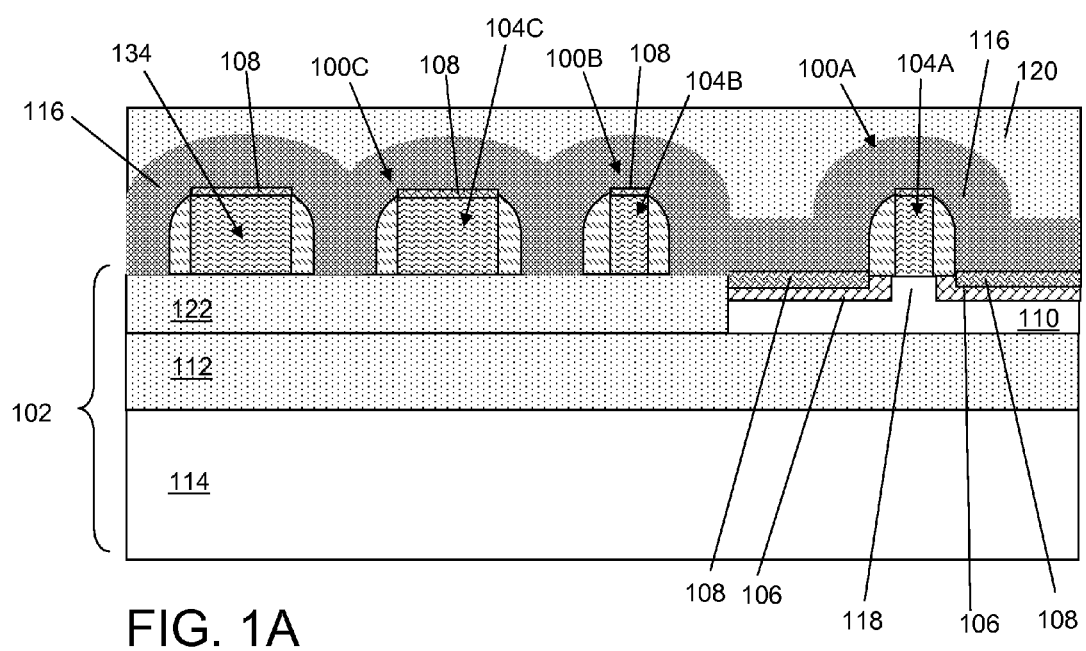
FIGS. 1A-B show embodiments of forming a transistor on an SOI substrate.
Figure 6A:
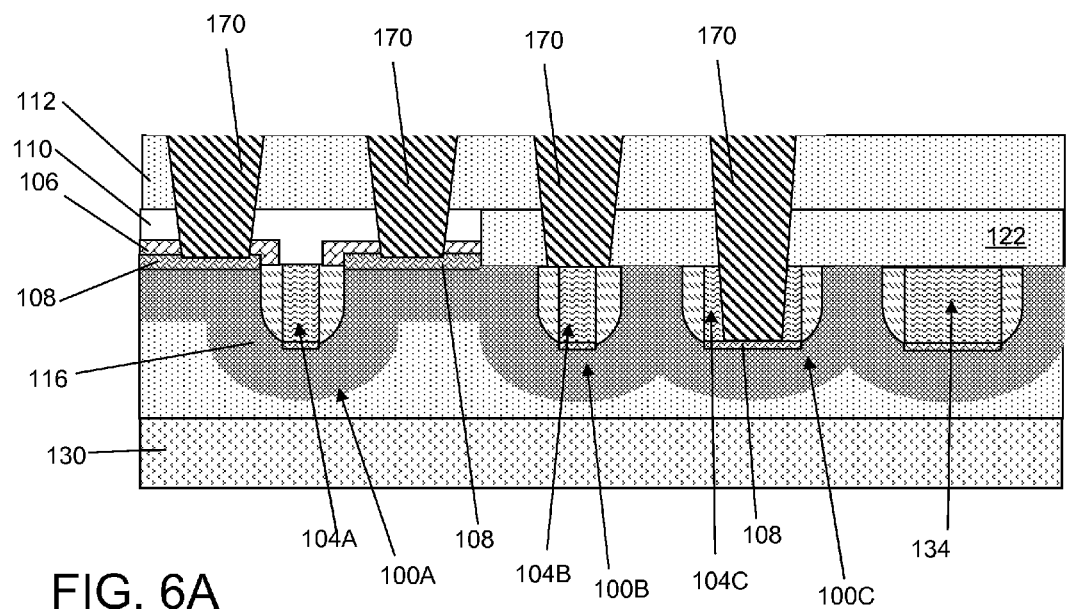
FIGS. 6A-B show embodiments of forming a contact.
Figure 6B:
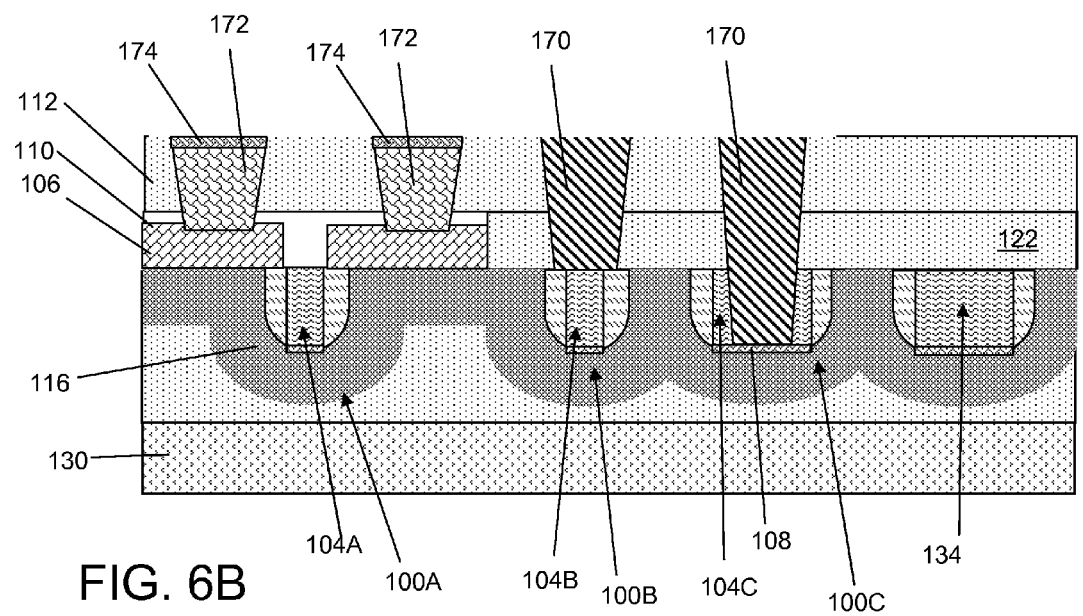
Figure 7:
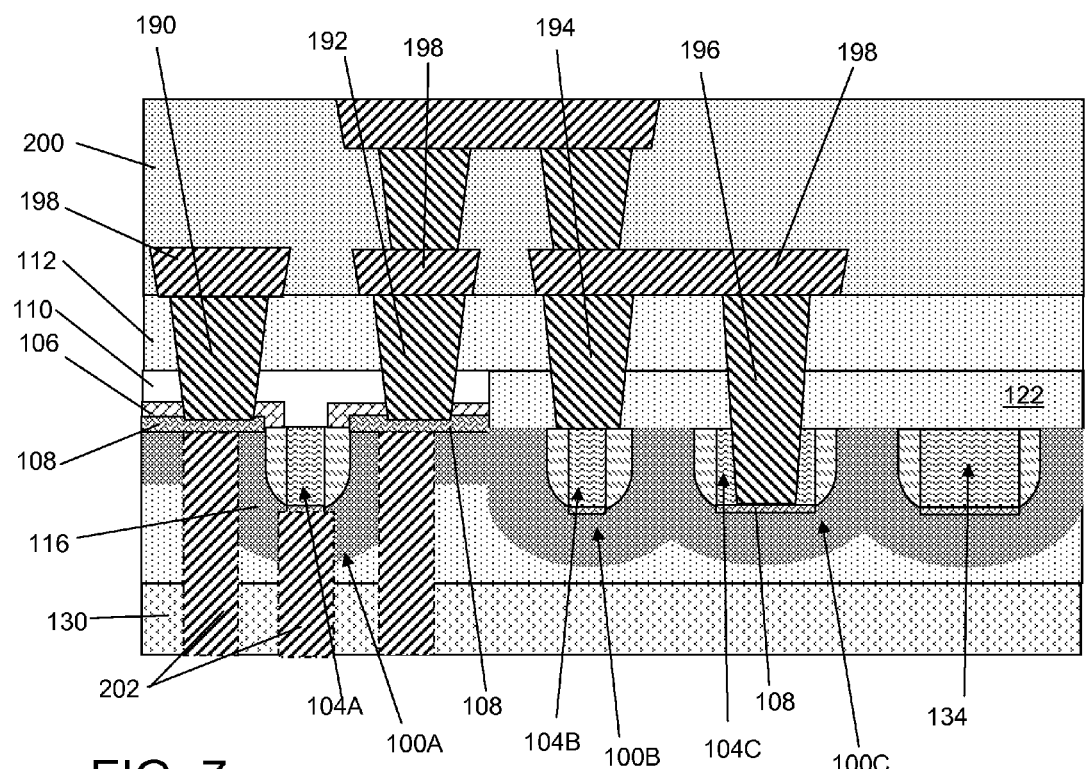
FIG. 7 shows forming at least one wiring and a transistor according to embodiments of the disclosure.

Turning to the drawings, FIGS. 1A-7 show embodiments of a method of forming wiring to a transistor, with FIG. 7 showing embodiments of a transistor 100A-C including the wiring. In one embodiment shown in FIG. 1A, a transistor 100A-C is formed on a semiconductor-on-insulator (SOI) substrate 102 using masks that are mirror images of an intended layout. Mirror image masks are required, as will become apparent below, because transistor 100A-C is ultimately flipped over. As illustrated, the forming includes forming a gate 104A-C (no gate dielectric shown), a source/drain region 106 and associated silicide 108 for each, and a channel 118. (Note, channel 118 is shown only for transistor 100A, but may be present for transistors 100B-C at another location, e.g., into or out of the plane of the page.) As shown in FIG. 1A, transistor 100A-C forming may also include forming an isolation region 122 for transistor 100A-C. Isolation region 122 is formed between transistors to provide isolation and to define the transistor widths as necessary. The formation of this isolation region 122 typically involves etching away regions of SOI layer 110, refilling with an insulator (e.g., $SiO_2$), and planarizing. Electrical contacts to the gates (e.g., 194 and 196 in FIG. 7) are formed in places where the gate is over an isolation region 122. Gates 104A-C may include any now known or later developed gate polysilicon or gate metal. For description purposes, gate 104A and 104C include polysilicon and gate 104B includes a metal. SOI substrate 102 includes a semiconductor-on-insulator (SOI) layer 110, a buried insulator layer 112 and a silicon substrate 114. Transistor 100A shows a longitudinal plane at which contacts 190 and 192 (not shown, see FIG. 7) are made to source/drain region 106 thereof; transistor 100B shows a longitudinal plane at which a contact 194 (not shown, see FIG. 7) to metal gate 104B thereof is made; and transistor 100C shows a longitudinal plane at which contact 196 (not shown, see FIG. 7) is made to polysilicon gate 104C thereof.

In an alternative embodiment, rather than using an SOI substrate 102, the teachings of the application may be applied where buried insulator layer 112 is replaced with an etch stop layer 112 (same location) selective to substrate 114. Etch stop layer 112 may include any now known or later developed etch stop materials, such as silicon nitride ($Si_3N_4$), etc. For purposes of clarity, the following description shall refer only to SOI substrate 102. However, the teachings of the disclosure are equally applicable to the etch stop layer embodiment.

FIG. 1A also shows forming of an inverted alignment mark 134 in the gate material layer. Inverted alignment mark 134 could also be formed in any of the other layers that are found to be convenient. The purpose of inverted alignment mark 134 will be described herein.

Transistor 100A-C and alignment mark 134 may be formed using any now known or later developed integrated circuit (IC) chip fabrication processes, e.g., photolithography, etc. SOI layer 110 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Buried insulator layer 112 may include but is not limited to: silicon nitride ($Si_3N_4$), silicon oxide ($SiO_2$)(typical), fluorinated $SiO_2$ (FSG), hydrogenated silicon oxycarbide (SiCOH), porous SiCOH, boro-phosho-silicate glass (BPSG), etc. Silicide 108 may be formed using any now known or later developed technique, e.g., depositing a metal such as titanium, nickel, cobalt, etc., annealing to have the metal react with silicon, and removing unreacted metal. As an option, an intrinsically stressed liner 116 (only one shown) may be formed over transistor 100A-C to stress a channel 118 thereof, i.e., either tensile stress for an NFET or compressive stress for a PFET.

Figure 1B:
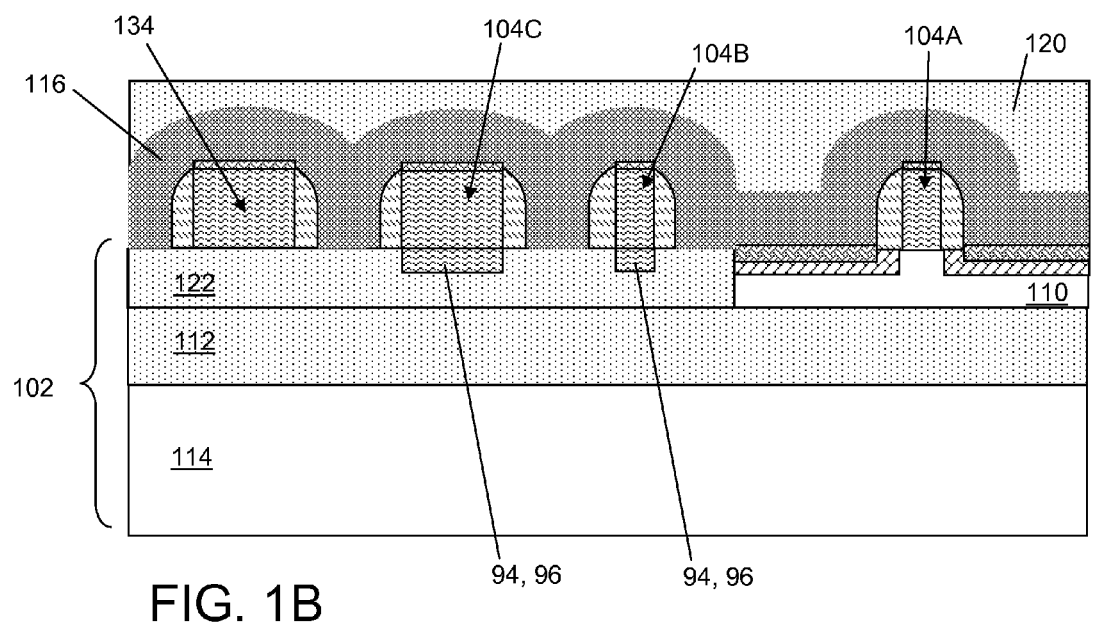

As shown in FIG. 1B, in an alternate embodiment, transistor 100A-C forming may also include forming an opening 94 through isolation region 122, prior to forming gate 104A-C (shown above openings 94), at a spot at which a contact must contact gate 104A-C. Opening 94 is filled with a material used to form gate 104A-C, e.g., polysilicon or a metal, to form a gate extension 96. The purpose of this embodiment will be described herein.

FIGS. 1A-B also show forming a dielectric layer 120 over transistor 100A-C, i.e., over gate 104A-C and/or stress dielectric layer 116, if used. Dielectric layer 120 may include may include but is not limited to: silicon nitride ($Si_3N_4$), fluorinated $SiO_2$ (FSG), hydrogenated silicon oxycarbide (SiCOH), porous SiCOH, boro-phosho-silicate glass (BPSG), etc. In one embodiment, dielectric layer 120 includes silicon oxide ($SiO_2$).

Figure 2:
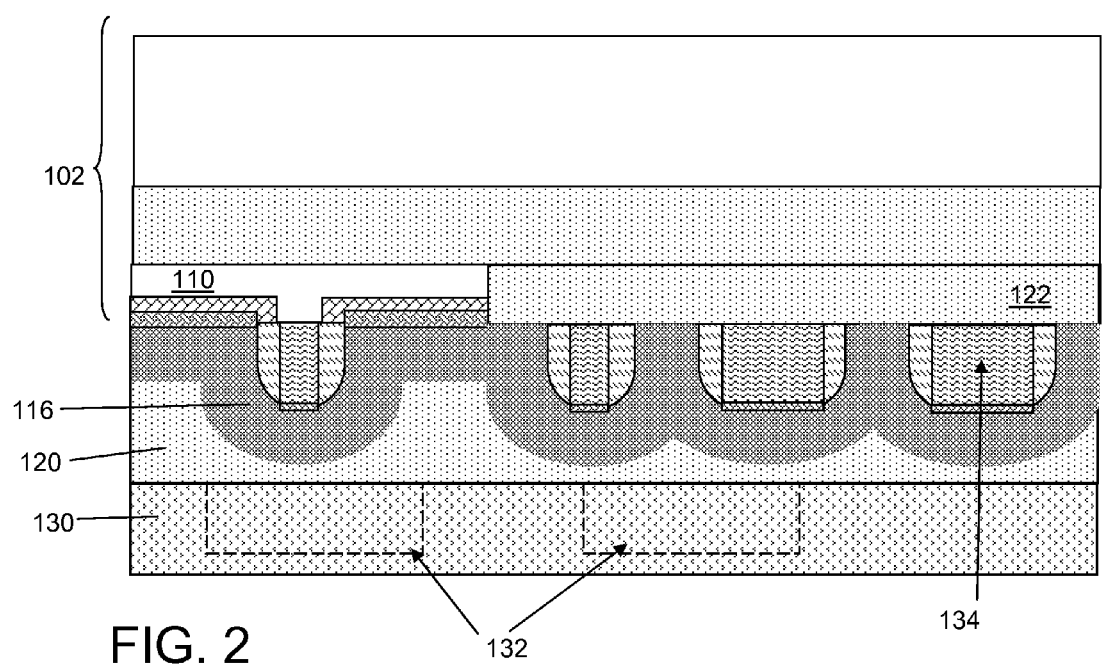
FIG. 2 shows bonding of a substrate to the SOI substrate according to one embodiment.

As shown in FIG. 2, dielectric layer 120 (SOI substrate 102) is bonded to another substrate 130. Substrate 130 may be a blank substrate (e.g., of silicon) or a substrate including devices and/or wiring 132 (shown schematically) patterned therein. Substrate 130 may also include a material other than silicon. Any conventional three-dimensional integration (3DI) processing may be employed to ensure mating circuitry. Based on this process, it is possible to bond SOI substrate 102 to some other sort of substrate, e.g., silicon carbide, for higher heat conductivity, or quartz for RF applications, or perhaps an electrically conducting substrate to apply electrical power. Inverted alignment marks 134 may be used to ensure proper alignment during bonding of substrate 130. Alignment marks 134 are only illustrative, and other types of marks may be employed. In one embodiment, substrate 130 may not be silicon, but materials such as, but not limited to: glass, polymers and metals.

Figure 3:
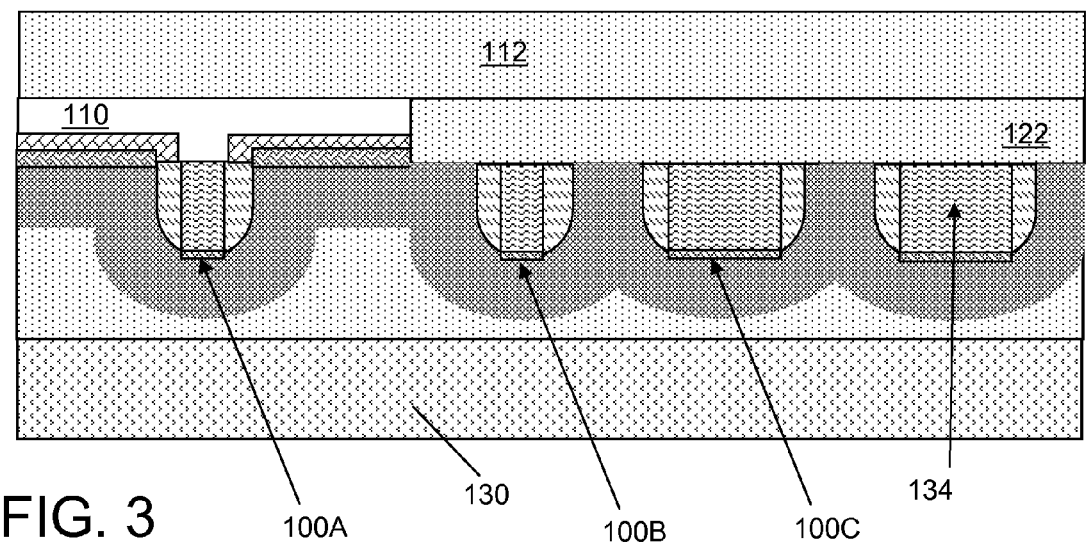
FIG. 3 shows removal of a silicon substrate of the SOI substrate according to one embodiment.

FIG. 3 shows removing silicon substrate 114 (FIGS. 1A-1B) from SOI substrate 102 (FIGS. 1A-1B) to buried insulator layer 112, e.g., by a reactive ion etch (RIE) or other etching process. As illustrated, transistor 100A-C and the remainder of SOI substrate 102 have been inverted for further processing. (Note, even though buried insulator layer 112 is no longer "buried", the nomenclature shall continue to be used for consistency purposes).

Figure 4A:
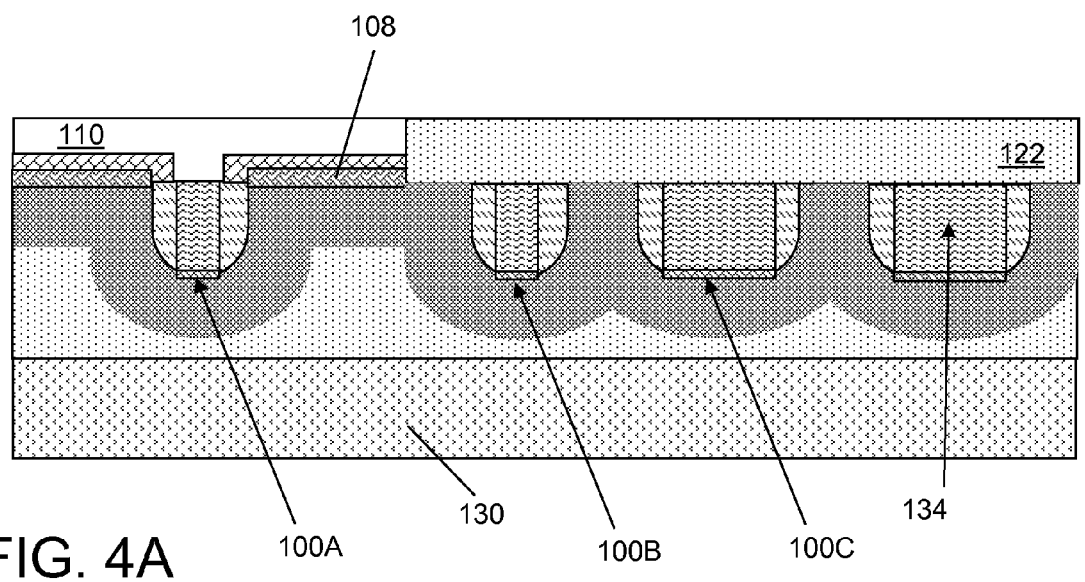
FIGS. 4A-D show alternative embodiments of a layer adjacent to a channel.
Figure 4B:
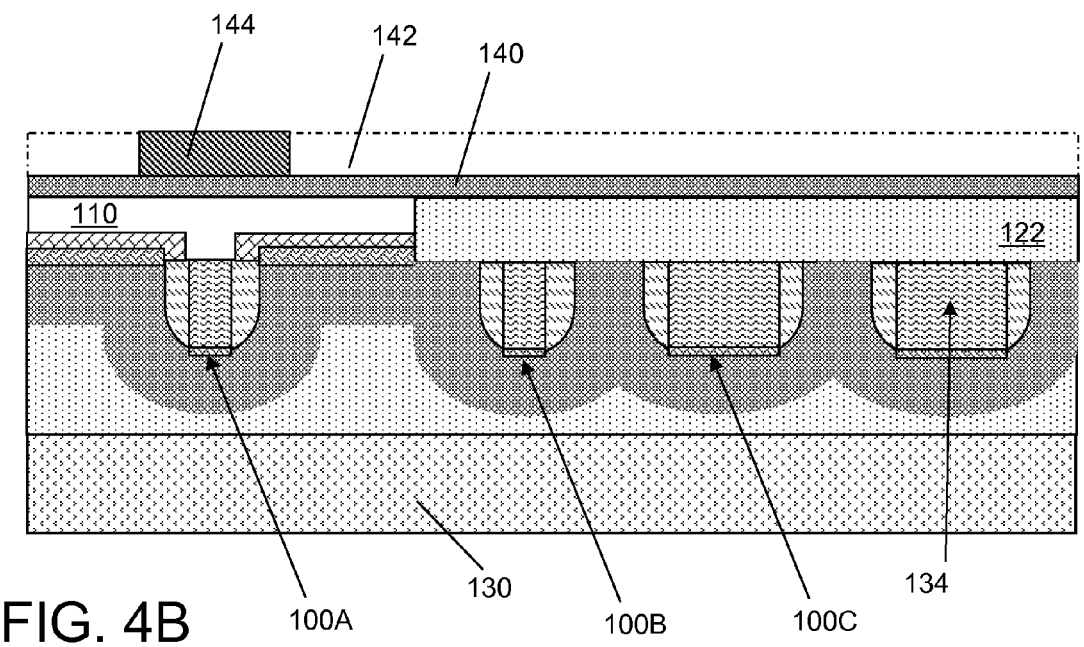
Figure 4C:
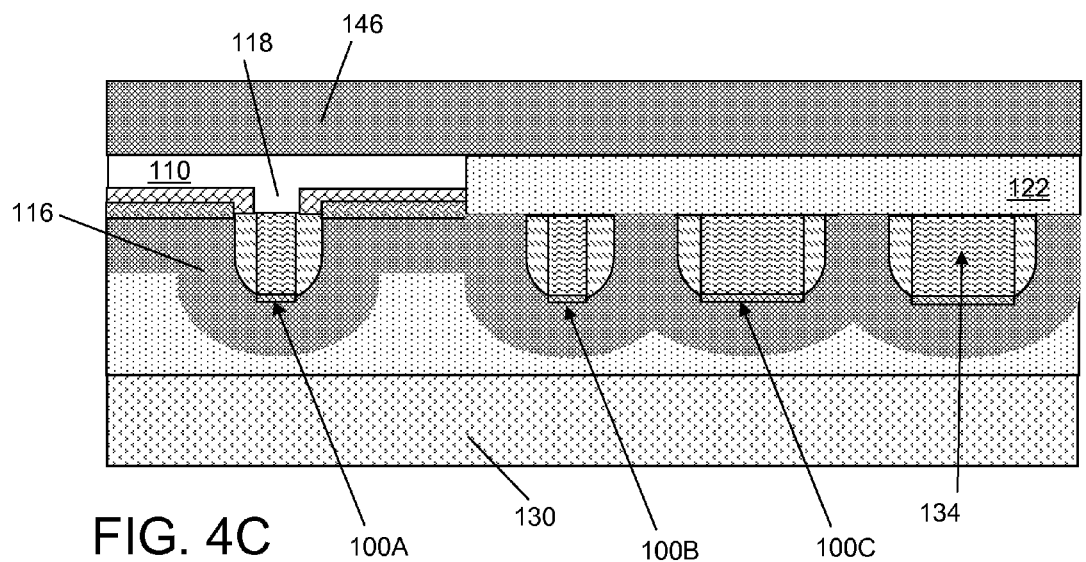

FIGS. 4A-D show optional processes that may occur at this stage. In one embodiment, shown in FIG. 4A, buried insulator layer 112 (FIG. 3) may be removed, e.g., by etching, and, as shown in FIG. 4B, a thin oxide layer 140 may be formed, followed by a conducting layer 142 (in phantom) (e.g., a metal or polysilicon). Conducting layer 142 may be patterned to form a back gate 144 (shown schematically) for transistor 100A, which could be used to control a threshold voltage ($V_t$) or for switching. Alternatively, as shown in FIG. 4C, buried insulator layer 112 (FIG. 3) may be removed, e.g., by etching, and an intrinsically stressed dielectric layer 146 may be formed adjacent to channel 118 (and isolation region 122) of transistor 100A-C to enhance performance, e.g., by applying a tensile stress for an NFET or compressive stress for a PFET. A planarizing layer (not shown) may be applied. In this fashion, two stressed dielectric layers 116 and 146 may be used to apply stress to channel 118.

Figure 4D:
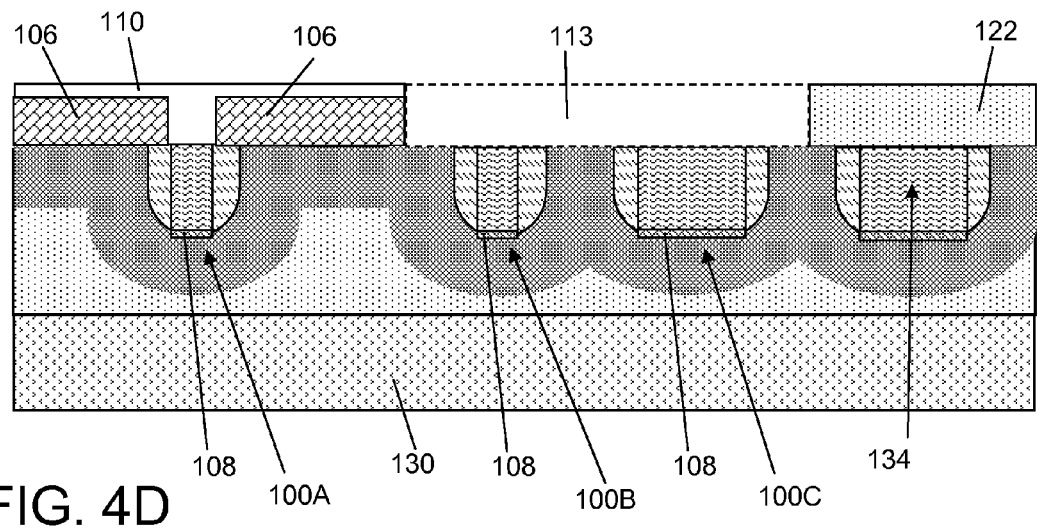

FIG. 4D shows an alternative embodiment including forming an isolation region 113 for transistor 100B-C from the channel side. In this embodiment, a mask (not shown) would be applied at the stage shown in FIG. 4A, and SOI layer 110 etched away between transistors 100B-C, shown in phantom. An insulator, e.g., silicon oxide ($SiO_2$), would be deposited to fill the space. In this case, an extra masking step may be required during transistor 100A-C formation before silicide 108 formation to prevent silicide formation in unwanted places between devices (as shown in FIG. 4D, where silicide is not present in silicon layer 110). Silicide wire connections could also be formed in such a process, if desired. Alternatively, as shown in FIG. 4A, silicide 108 could also be etched from the bottom when the silicon trenches are etched. In either case, a new insulating layer (e.g., oxide)(not shown, but the same as buried insulator layer 112) may be deposited on top of the structure shown. Based on this embodiment, it may be possible to omit isolation region 122 (FIG. 4D) processing during transistor 100A-C formation on SOI substrate 102. This would eliminate a very complex process that causes significant topography variations that interfere with ideal gate lithography. With a completely planar surface, it should be possible to reliably fabricate shorter, more uniform gates, improving performance. Elimination of isolation regions may also eliminate or greatly reduce narrow channel effects, which significantly influence SRAM devices.

The remaining processing shall be described as though the alternative embodiments of FIGS. 4A-C have not been employed.

Figure 5:
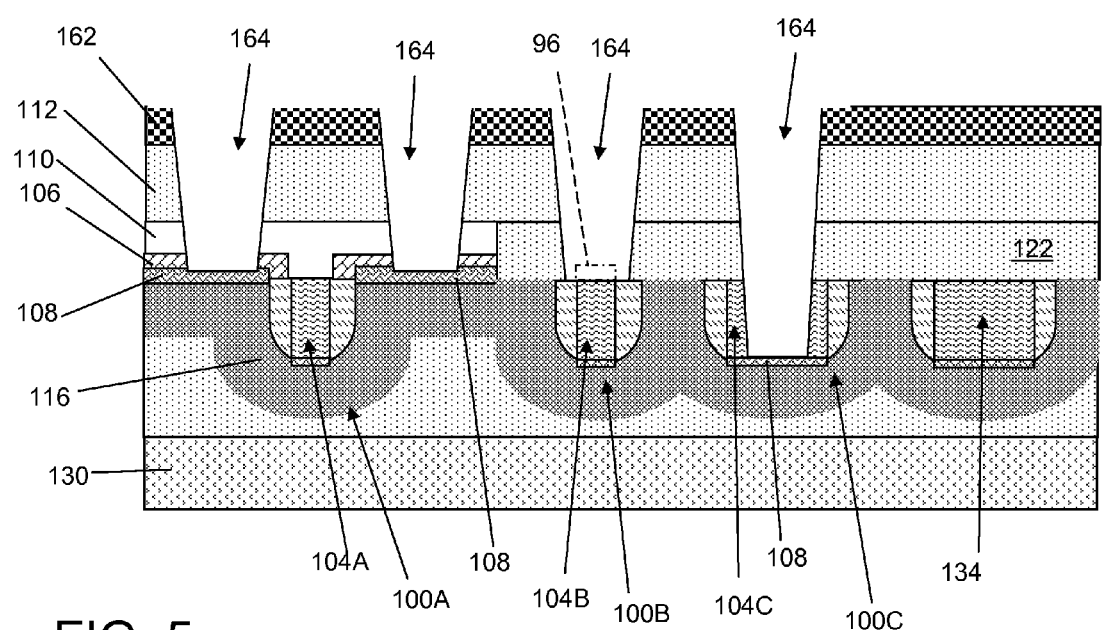
FIG. 5 shows forming contact via holes according to one embodiment.

FIGS. 5 and 6A-B show forming a contact 190-196 (FIG. 7) to at least one of source region 106, drain region 106 and gate 104A-C. FIGS. 5 and 6A-B show contacts formed through buried insulator layer 112. However, if the embodiments of FIGS. 4A-D were employed, then contacts would extend past back gate(s) 144 (FIG. 4B) and through thin oxide layer 140, or through stress dielectric layer 146 (FIG. 4C), or would stop on the doped source/drain regions 106 (FIG. 4D), instead of on silicide 108. FIG. 5 shows patterning (using mask 162) and etching contact via holes 164 through buried insulator layer 112 (or other materials per FIGS. 4A-D) to each of source/drain region 106 and gate 104A-C, and, as shown for transistors 100A and 100C, etching through source/drain region 106 to expose a conductor thereof and etching through gate 104C or to gate 104B to expose a conductor thereof. For source/drain region 106, the conductor is silicide 108 thereof. For metal gate 104B, the conductor is the metal thereof, and etching only proceeds to the metal. For polysilicon gate 104C, the conductor is silicide 108 of gate 104C, and the etching proceeds through gate 104C to silicide 108. It is understood that if silicide 108 was not formed previously, and it is desired for the conductive material that fills opening 164, it may be formed before the fill process. As observed for openings 164 for transistor 104C and by comparing openings 164 for source/drain 106 of transistor 100A versus gate 104B of transistor 100B, the conductor of source/drain region 106 and gate 104A-C may not be at the same depth. In situations like that of transistor 100C, it may be necessary, to perform a separate etching for source/drain region 106 and gate 104C. This process may include etching and stopping at source/drain region 106, forming silicide 208 (acts as additional etch stop), and continuing etching through (or to) the conductor (i.e., silicide 108) of gate 104C. In other situations such as that shown for transistor 100B, generating gate extension 96 (as shown in phantom in FIG. 5 and in solid lines in FIG. 1B) during transistor 100A-C formation may allow each opening 164 to be approximately the same depth.

As shown in FIG. 6A, in one embodiment, forming metal 170, e.g., copper (Cu), tungsten (W), etc., in contact via holes 164 (FIG. 5) is next. This process may include depositing any now known or later developed liner material (not shown for clarity), e.g. tantalum nitride (TaN), depositing the metal and planarizing, e.g., via chemical mechanical polishing (CMP). In an alternative embodiment, shown in FIG. 6B, contacts 190-192 (FIG. 7) may be ohmic contacts. In this case, the semiconductor (e.g., silicon) 172 is re-grown (epitaxially) in openings 164 (FIG. 5) and silicided 174. In alternate embodiments (not shown) the gate contacts 194-196 (FIG. 7) may also be re-grown semiconductors. Note, FIG. 7 shows only the embodiment of FIG. 6A.

FIG. 7 shows forming at least one wiring 198 to contacts 190-196. This process may include any now known or later developed processing, e.g., depositing a dielectric layer, patterning and etching openings therein, depositing a metal and planarizing, and repeating as necessary. As an alternative to the embodiments of FIGS. 5, 6A-B and 7 described above, contact 190-196 forming and the at least one wiring 198 forming may include using a dual damascene process. In this case, copper (Cu) may be used to improve resistance.

FIG. 7 also shows forming at least one low dielectric constant (low-k) layer 200 adjacent to buried insulator layer 112, i.e., for subsequent metal and via layers. In this case, the above-described contact forming and the at least one wiring forming may include forming the contact and the at least one wiring in the low-k dielectric layer. Use of the low-k dielectric improves capacitance.

FIG. 7 shows transistor(s) 100A-C, each including a gate 104A-C, a source/drain region 106, a channel 118 adjacent to gate (104A only), and at least one contact 190-196 to at least one of source region 106, drain region 106 and gate 104A-C. At least one contact 190-196 extends from a channel side of the transistor. A first dielectric stress layer 116 may be applied adjacent to gate 104A-C and a second dielectric stress layer 146 (FIG. 4C) may be applied adjacent to channel 118 to improve performance. Transistor 100A-C may also include at least one contact 202 to at least one of source/drain region 106 and gate 104A-C that extends from a gate side of transistor 100A-C, e.g., when transistor 100A-C are part of a 3DI system.

The above-described disclosure addresses spacing and performance problems related to contacts, and may allow relaxation of overlay requirements and more uniform polyconductor topography. Eliminations of openings in stress dielectric layer 116 may remove limitations on contact height and may allow use of other intrinsically stressed materials. In addition, the disclosure may provide a way to contact the second layer of devices without introducing an extra layer of metal, and creates a variety of options for changing current transistor processing in ways that may eliminate difficult steps (such as trench isolation formation) and/or enable alternate device topologies (such as back-end gates for transistors). For example, contacts from the back rather than the front aid 3D integration schemes. Since the height of the contacts are independent of poly conductor height in the disclosure, contacts 190-196 can be shorter, which may lead to relaxing the sidewall steepness requirements of the contacts and may lower their resistance. Performance may be improved by, among others, reducing contact-gate capacitance and reducing resistance, potentially allowing strain inducement from the channel side and the gate side of a device, adding a back gate for threshold voltage control and lowering resistance for metal gates by providing metal-to-metal contact. In addition, the disclosure opens a piece of design space for advanced transistors that is not available presently.

The circuit as described above is part of the design for an integrated circuit chip. The chip design is created in a graphical computer programming language, and stored in a computer storage medium (such as a disk, tape, physical hard drive, or virtual hard drive such as in a storage access network). The designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which may include multiple copies of the chip design in question that are to be formed on a wafer. The photolithographic masks are utilized to define areas of the wafer (and/or the layers thereon) to be etched or otherwise processed. The method as described above is also used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method of forming wiring to a transistor, the method comprising:
    forming a transistor on a semiconductor-on-insulator (SOI) substrate using masks that are mirror images of an intended layout, the forming including forming a gate and a source/drain region for each and a channel, the SOI substrate including a semiconductor-on-insulator (SOI) layer, a buried insulator layer and a silicon substrate;
    forming a dielectric layer over the transistor;
    bonding the dielectric layer to another substrate;
    removing the silicon substrate from the SOI substrate to the buried insulator layer;
    forming a contact to each of the source/drain region and the gate from a channel side of the gate; and
    forming at least one wiring to the contacts on the channel side of the gate.

2. The method of claim 1, wherein the forming further includes forming inverted alignment marks on the SOI substrate.

3. The method of claim 1, further comprising forming an isolation region for the transistor from the channel side.

4. The method of claim 1, wherein the another substrate includes one of: a blank substrate and a substrate including at least one of the following: devices and wiring patterned therein.

5. The method of claim 4, wherein the another substrate includes a material other than silicon.

6. The method of claim 1, wherein the contact forming includes:
    patterning and etching a contact via hole through the buried insulator layer to each of the source/drain region and the gate;
    etching through the source/drain region to expose a conductor thereof and through or to the gate to expose a conductor thereof; and
    forming metal in the contact via holes.

7. The method of claim 6, wherein the conductor includes: a) for the source/drain region, a silicide of the source/drain region, and b) for the gate: b1) in the case that the gate includes polysilicon, a silicide of the gate, or b2) in the case that the gate includes a metal, the metal of the gate.

8. The method of claim 6, wherein the patterning and etching includes performing a separate etching for the source/drain region and the gate.

9. The method of claim 6, wherein the etching includes stopping at the source/drain region, forming a silicide, and continuing etching through to the conductor of the gate.

10. The method of claim 1, wherein the contacts are ohmic contacts.

11. The method of claim 8, wherein the contacts forming includes:
    patterning and etching a contact via hole through the buried insulator layer to each of the source/drain region and the gate;
    etching through the source/drain region to expose a conductor thereof and through or to the gate to expose a conductor thereof; and
    re-growing silicon in the contact via holes and forming a silicide.

12. The method of claim 1, further comprising:
    removing the buried insulator layer;
    forming a thin oxide layer;
    forming a conducting layer;
    patterning the conducting layer to form a back gate for the transistor.

13. The method of claim 1, further comprising:
    removing the buried insulator layer; and
    forming a stressed dielectric layer adjacent to a channel of the transistor.

14. The method of claim 1, wherein the transistor forming includes
    forming an isolation region for the transistor;
    forming an opening through the isolation region prior to forming the gate; and
    filling the opening with a material used to form the gate.

15. The method of claim 1, wherein the contact forming and the at least one wiring forming includes using a dual damascene process.

16. The method of claim 1, further comprising forming at least one low dielectric constant (low-k) layer adjacent to the buried insulator layer, and the contact forming and the at least one wiring forming include forming the contact and the at least one wiring in the low-k dielectric layer.

17. A method of forming wiring to a transistor, the method comprising:
    forming a transistor on a semiconductor layer positioned over an etch stop layer positioned over a silicon substrate using masks that are mirror images of an intended layout, the forming including forming a gate and a source/drain region for each;
    forming an insulating layer over the transistor;
    bonding the dielectric to another substrate, the another substrate including one of: a blank substrate and a substrate including at least one of the following: devices and wiring patterned therein;
    removing the silicon substrate to the etch stop layer;

forming a contact through the etch stop layer to each of the source/drain region and the gate, wherein the contact forming includes:
  patterning and etching a contact via hole through the etch stop layer to each of the source/drain region and the gate,
  etching through the source/drain region to expose a conductor thereof and through or to the gate to expose a conductor thereof, wherein the conductor includes: a) for the source/drain region, a silicide of the source/drain region, and b) for the gate: b1) in the case that the gate includes polysilicon, a silicide of the gate, or b2) in the case that the gate includes a metal, the metal of the gate, and
  forming metal in the contact via holes; and
forming at least one wiring to the contacts.

* * * * *